(12) United States Patent
Zimmerman

(10) Patent No.: US 7,803,307 B2
(45) Date of Patent: Sep. 28, 2010

(54) ULTRA HIGH-TEMPERATURE PLASTIC PACKAGE AND METHOD OF MANUFACTURE

(75) Inventor: Michael Zimmerman, North Andover, MA (US)

(73) Assignee: Interplex QLP, Inc., College Point, NY (US)

( * ) Notice: Subject to any disclaimer, the term of this patent is extended or adjusted under 35 U.S.C. 154(b) by 827 days.

(21) Appl. No.: 11/146,856

(22) Filed: Jun. 7, 2005

(65) Prior Publication Data
US 2009/0295036 A1 Dec. 3, 2009

Related U.S. Application Data

(60) Provisional application No. 60/577,530, filed on Jun. 7, 2004.

(51) Int. Cl.
*C08J 5/02* (2006.01)
*C08G 63/06* (2006.01)

(52) U.S. Cl. ................. 264/331.11; 528/271

(58) Field of Classification Search ............ 264/331.11, 264/272.11, 272.17
See application file for complete search history.

(56) References Cited

U.S. PATENT DOCUMENTS

| | | | | |
|---|---|---|---|---|
| 3,718,621 A | * | 2/1973 | Wilson | 528/308.5 |
| 4,430,969 A | * | 2/1984 | Holtzberg et al. | 123/90.39 |
| 4,632,798 A | * | 12/1986 | Eickman et al. | 264/272.17 |
| 5,608,267 A | * | 3/1997 | Mahulikar et al. | 257/796 |
| 5,616,680 A | * | 4/1997 | Linstid, III | 528/183 |
| 6,296,930 B1 | * | 10/2001 | Ohbe et al. | 428/304.4 |
| 6,348,163 B1 | * | 2/2002 | Long et al. | 252/299.01 |
| 7,022,794 B2 | | 4/2006 | Arai et al. | |
| 7,319,125 B2 | | 1/2008 | Arjunan et al. | |
| 2002/0176991 A1 | * | 11/2002 | Jackson et al. | 428/411.1 |
| 2004/0140450 A1 | * | 7/2004 | Waggoner et al. | 252/299.01 |

OTHER PUBLICATIONS

Cluff et al. 10A.1 Electronic Packaging Technologies, CR Press L.L.C. (2001).

* cited by examiner

*Primary Examiner*—Jennifer K Michener
*Assistant Examiner*—Magali P Slawski
(74) *Attorney, Agent, or Firm*—Weingarten, Schurgin, Gagnebin & Lebovici LLP

(57) ABSTRACT

A package for microelectronic circuits includes a frame made of a high molecular weight plastic material, such as a liquid crystal polymer (LCP), attached to a flange, or leadframe. The plastic material is injection molded to the flange. Initial polymerization of the plastic material can occur in a liquid state and results in an intermediate material having an initial melting temperature. After the frame is injection molded, the frame is heated and undergoes further (secondary) polymerization, thereby lengthening polymer chains in the plastic material. These longer polymer chains have higher molecular weight, and the resulting final material has a higher melting temperature, than the intermediate material. The resulting ultra-high molecular weight polymer can withstand high temperatures, such as those encountered during soldering. Thus, after the further (secondary) polymerization, a die can be soldered to the flange, without damaging the plastic frame.

62 Claims, 7 Drawing Sheets

Common Monomers Used For Liquid Crystal Polymers (HQ) Hydroquinone (TA) Terephthalic Acid (IA) Isophthalic Acid 2, 6 Naphthalene Dicarboxylic Acid (HBA) 4, Hydroxybenzoic Acid Bisphenol (BP)

ature than that of conventional plastics. Other manufacturing processes and products would benefit from the use of a plastic whose melting temperature can be raised after the plastic has been molded into a shape, but before a subsequent step that involves a temperature higher than the plastic's original melting point.

ULTRA HIGH-TEMPERATURE PLASTIC PACKAGE AND METHOD OF MANUFACTURE

CROSS REFERENCE TO RELATED APPLICATIONS

This application claims the benefit of U.S. Provisional Patent Application No. 60/577,530, filed Jun. 7, 2004, titled "Ultra High-Temperature Plastic Package and Method of Manufacture."

STATEMENT REGARDING FEDERALLY SPONSORED RESEARCH OR DEVELOPMENT (Not applicable)

BACKGROUND OF THE INVENTION

The present invention relates to circuit packages for integrated circuits and, more particularly, to such circuit packages that include polymers having high melting temperatures.

Various plastics, such as liquid crystal polymers (LCPs), are used in a wide range of manufactured products, including consumer goods, medical devices and packages for electronic integrated circuits. In many instances, plastic is heated during one or more manufacturing steps of a product or later, such as while the product is in use. For example, many products are manufactured by an injection molding process, which includes heating plastic to soften it and injecting the softened plastic into a mold. The plastic takes on the shape of the mold and (ideally) retains that shape during subsequent manufacturing steps and throughout the useful life of the resulting product.

Some manufacturing processes and products could be improved through the use of a plastic that has a higher melting temperature than that of conventional plastics. Other manufacturing processes and products would benefit from the use of a plastic whose melting temperature can be raised after the plastic has been molded into a shape, but before a subsequent step that involves a temperature higher than the plastic's original melting point.

For example, while operating, many devices in microelectronics circuit packages (such as some integrated circuits used in high-power radio transmitters) dissipate large amounts of heat. In such a circuit package, solder is used to attach a microelectronic device (a "die") to a metal or other heat-conductive component (such as a mounting "flange" or "leadframe") to maximize heat transfer from the die to the metal component. In a typical application, the metal component is attached to a heat sink, which is cooled, such as by natural air convection, forced airflow (typically from a fan) or a circulating cooling liquid.

Various solders, including gold-tin (AuSn) and gold-silicon (AuSi), are used to attach the die to the metal component of the circuit package. When the die is attached to the metal component, the solder is heated to a temperature (such as between about 280° C. and about 320° C. for AuSn or between about 390° C. and about 430° C. for AuSi) that exceeds the melting temperatures of conventional plastics. For example, most conventional plastics melt below about 300° C., and most liquid crystal polymers melt at temperatures near 330° C. or slightly higher. Consequently, conventional plastics, including conventional LCPs, cannot be used in circuit packages.

Instead, manufacturers typically use a ceramic material. However, ceramics must be brazed to the other components of a circuit package. Brazing is a high-temperature (approximately 800° C.) process, which creates mechanical problems, such as out-of-flatness, in the circuit packages. Furthermore, manufacturing processes that involve ceramics are expensive.

On the other hand, plastic is relatively inexpensive, and some LCPs have superior dielectric properties and other characteristics that would be desirable in electronic circuit packages. Unfortunately, the relatively low melting points of conventional LCPs and other plastics have prevented their practical use in such packages.

BRIEF SUMMARY OF THE INVENTION

A plastic material having a high melting temperature and a method for making such a plastic material are disclosed. The plastic material includes a high molecular weight polymer. The method increases the molecular weight of a polymer by continuing or resuming polymerization of the plastic material after an initial polymerization phase is completed. The initial polymerization typically occurs in a liquid state and can result in an intermediate solid material (to the extent plastics, such as liquid crystal polymers, are "solid"). In any case, the material produced by the initial polymerization (referred to herein as an "intermediate material") has an initial melting temperature. After the initial polymerization, the intermediate material is heated and undergoes further ("secondary") polymerization, thereby lengthening polymer chains in the material. Existing polymer chains bond together to form longer polymer chains. These longer polymer chains have higher molecular weight, and the resulting final material has a higher melting temperature, than the intermediate material. For example, plastic materials having melting temperatures exceeding about 400° C. can be made according to the disclosed method, although higher or lower melting temperatures can be achieved.

The disclosed plastic material can be used to make packages for microelectronic circuits and other useful products. For example, before, after or during the initial polymerization, the material is injection molded to form a frame on a metal flange. After the frame hardens, it is heated as disclosed herein to undergo further polymerization and raise its melting temperature. Subsequently, a die can be attached to the flange using a solder, such as AuSi, without melting the frame.

These and other features, advantages, aspects and embodiments of the present invention will become more apparent to those skilled in the art from the Detailed Description of the Invention, which follows.

BRIEF DESCRIPTION OF THE SEVERAL VIEWS OF THE DRAWINGS

The invention will be more fully understood by referring to the Detailed Description of the Invention in conjunction with the Drawings, of which.

DETAILED DESCRIPTION OF THE INVENTION

The contents of U.S. Provisional Patent Application No. 60/577,530, filed Jun. 7, 2004, titled "Ultra High-Temperature Plastic Package and Method of Manufacture," is hereby incorporated by reference herein.

Figure 1:
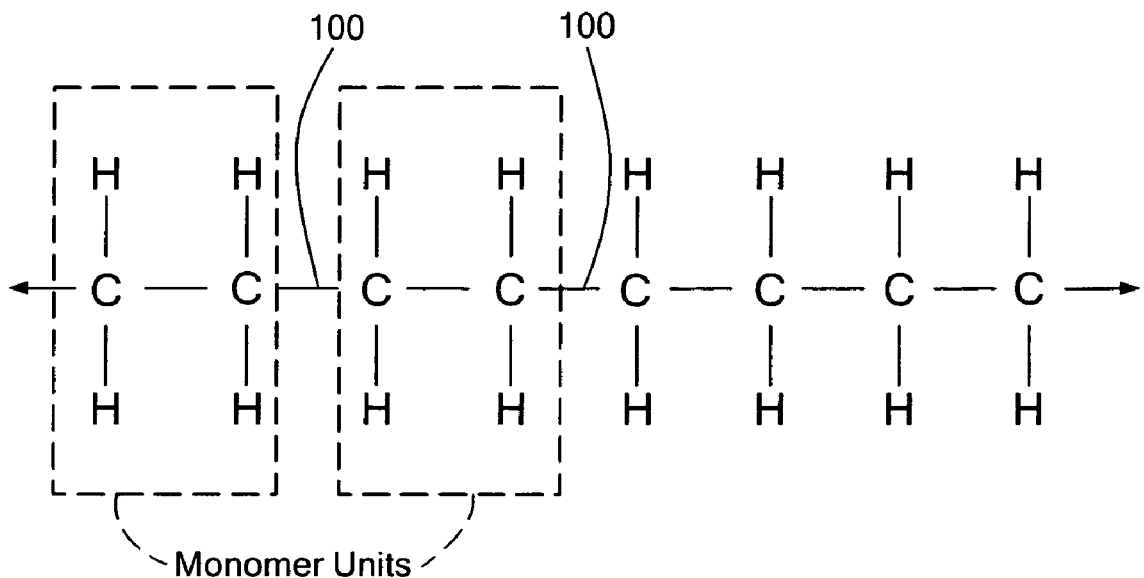
FIG. 1 is a schematic diagram of a prior art polymer molecule.
Figure 2:
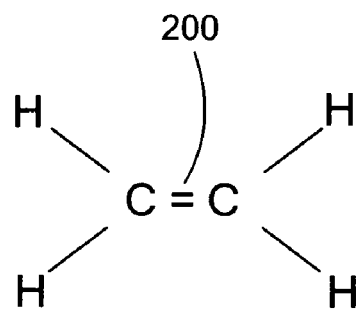
FIG. 2 is a schematic diagram a prior art monomer molecule used to synthesize the polymer molecule of FIG. 1.

A polymer is a chemical compound formed by the union of many identical, relatively simple molecules arranged in repeating, linked units to form a long, regular pattern, typically a chain. The linked units in the polymer chain are commonly referred to as "monomer units." FIG. 1 is a schematic diagram of an exemplary polymer (polyvinyl chloride). "Monomers" are the actual molecules used as the building blocks in the synthesis of a polymer. FIG. 2 is a schematic diagram of the monomer (chloroethene) used to synthesize polyvinyl chloride. Several forms of polymerization are known, including addition polymerization, condensation polymerization and reactive polymerization.

Heat, a radical or another catalyst is often used during polymerization to alter the monomers. During polymerization, electrons and/or atoms of the monomers are rearranged to bond the monomers together to form the polymer chain. Because of the rearrangement of electrons and/or atoms, the linked monomer units in the polymer chain are not identical to the constituent monomers. For example, the double bond 200 (FIG. 2) between the carbon atoms of the monomer chloroethene is broken during polymerization, and one of the electron pairs from the double bond is used to bond the monomer units to each other, as shown at 100 (FIG. 1).

A liquid crystal is a material that exhibits some attributes of a liquid and other attributes of a solid. One common form of liquid crystal is a liquid crystal polymer (LCP), however not all liquid crystals are polymers. The molecules of materials forming liquid crystals are known as "mesogens." The mesogens of a liquid crystal can form ordered structures having long-range order, with the long axes of the mesogenic groups oriented in one preferred direction. The liquid-like properties of liquid crystals arise from the fact that these mesogenic structures can readily flow past one another. The solid-like properties arise because the structures themselves are not disturbed when the sliding occurs.

In conventional polymerization processes, a polymer is created, typically in a liquid form, from monomers, and after the polymeric chains are grown, the resulting material is typically cooled to a solid form.

A polymer's molecular weight depends on the polymer's degree of polymerization, i.e., the lengths of the polymeric chains created. A monomer typically has a relatively small molecular weight, however a polymer typically includes up to millions of monomer units. Thus, polymers typically have high molecular weights. Properties, such as melting temperature, glass-transition temperature, heat deflection temperature and ductility, of a polymer are influenced by the polymer's molecular weight. However, all the molecules of a polymeric material typically do not have identical molecular weights. That is, during polymerization, some molecules grow longer than others. Because all the molecules of a polymeric material not necessarily have identical, lengths the material may not have a single, definite melting temperature. Instead, the material may gradually become softer as its temperature is raised over a relatively small range.

Traditional polymerization processes are limited in their abilities to create materials with extremely high molecular weights and, therefore, extremely high melting temperatures and other desirable mechanical and electrical properties. The disclosed method further polymerizes long-chain molecules. That is, polymeric chains in a polymer bond together to form longer chains. This results in materials with longer chains, therefore higher molecular weights and higher melting temperatures, than would otherwise be possible. For example, increases in melting temperatures of about 100° C. or more are possible.

Significantly, the disclosed method operates after a traditional polymerization process. This is referred to herein as "secondary polymerization." Thus, the disclosed method can operate on solid polymeric materials, although the method can also operate on polymeric materials that are liquids or in other states.

Figure 3:
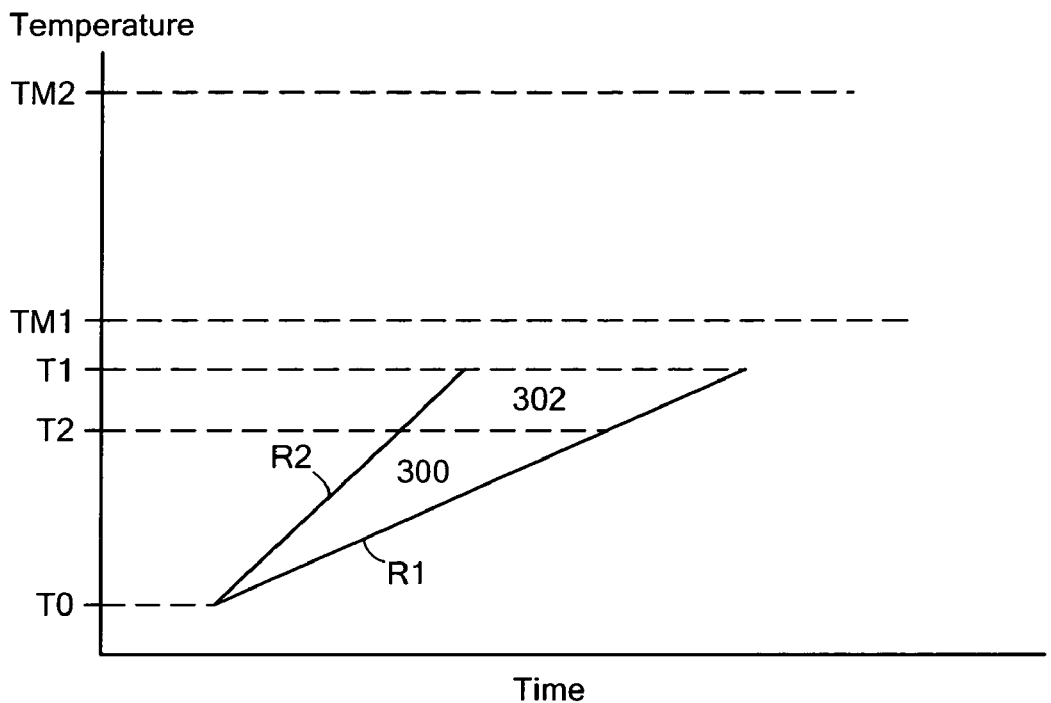
FIG. 3 is a graph of temperature increases during a portion of a secondary polymerization process, according to one embodiment of the present invention.
Figure 4:
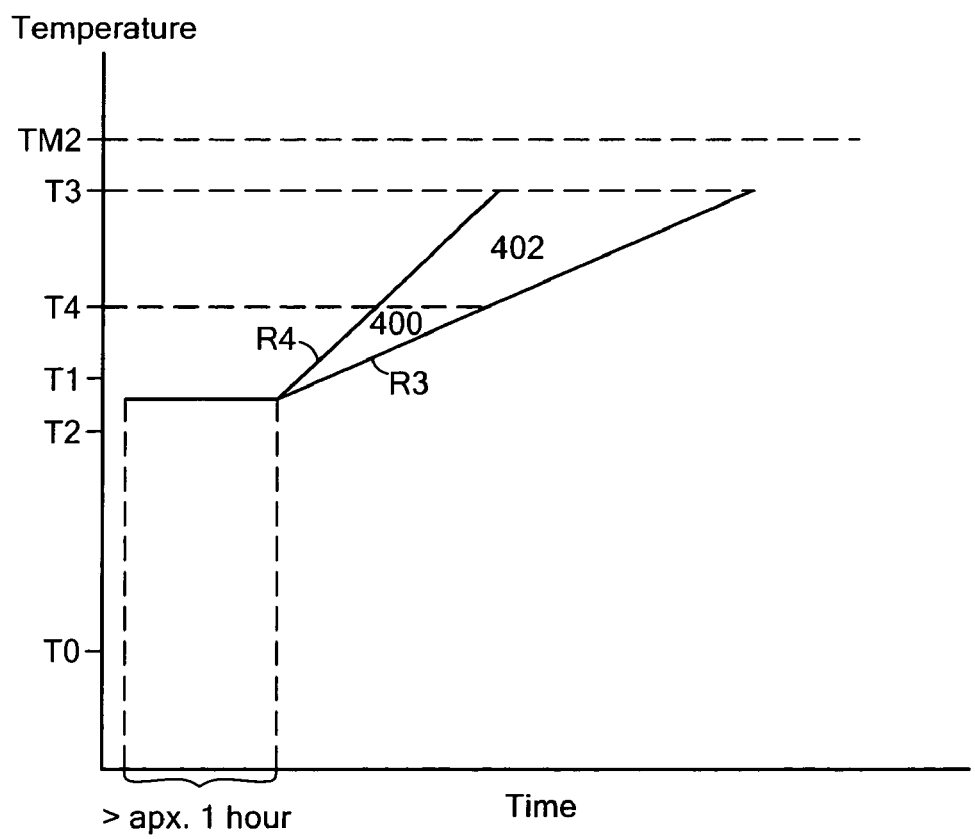
FIG. 4 is a graph of temperature increases during another portion of the secondary polymerization process of FIG. 3.

In one exemplary method, illustrated in two graphs in FIGS. 3 and 4, a polymeric material with an initial melting temperature (TM1) is further (secondarily) polymerized to increase its melting temperature to TM2. The temperature of the material (after the traditional polymerization process) is increased from its initial temperature (T0) at a rate of between about 0.1° C. per hour (R1) and about 10° C. per hour (R2) until the temperature of the material is between a first temperature (T1) about 10° C. below the initial melting temperature and a second temperature (T2) about 30° C. below the initial melting temperature of the material. Thus, the temperature of the material is raised, such that the material's time-temperature profile remains within region 300 and 302 until the material's temperature is within region 302.

Once this temperature is achieved, the temperature of the material is maintained for a minimum of about one hour, as shown in the graph of FIG. 4. Then, the temperature of the material is increased at a rate of between about 0.1° C. per hour (R3) and about 110° C. per hour (R4) until the temperature of the material is between a third temperature (T3) about 40° C. below the desired new melting temperature and a fourth temperature (T4) about 50° C. below the desired new melting temperature. Thus, the temperature of the material is raised, such that the material's time-temperature profile remains within region 400 and 402. In one embodiment, the temperature of the material is increased to at least about 340° C. In other embodiments, the temperature is increased to at least about 355° C. and 390° C., respectively. The highest temperature to which the material is raised during secondary polymerization is referred to herein as the "final temperature."

Figure 5:
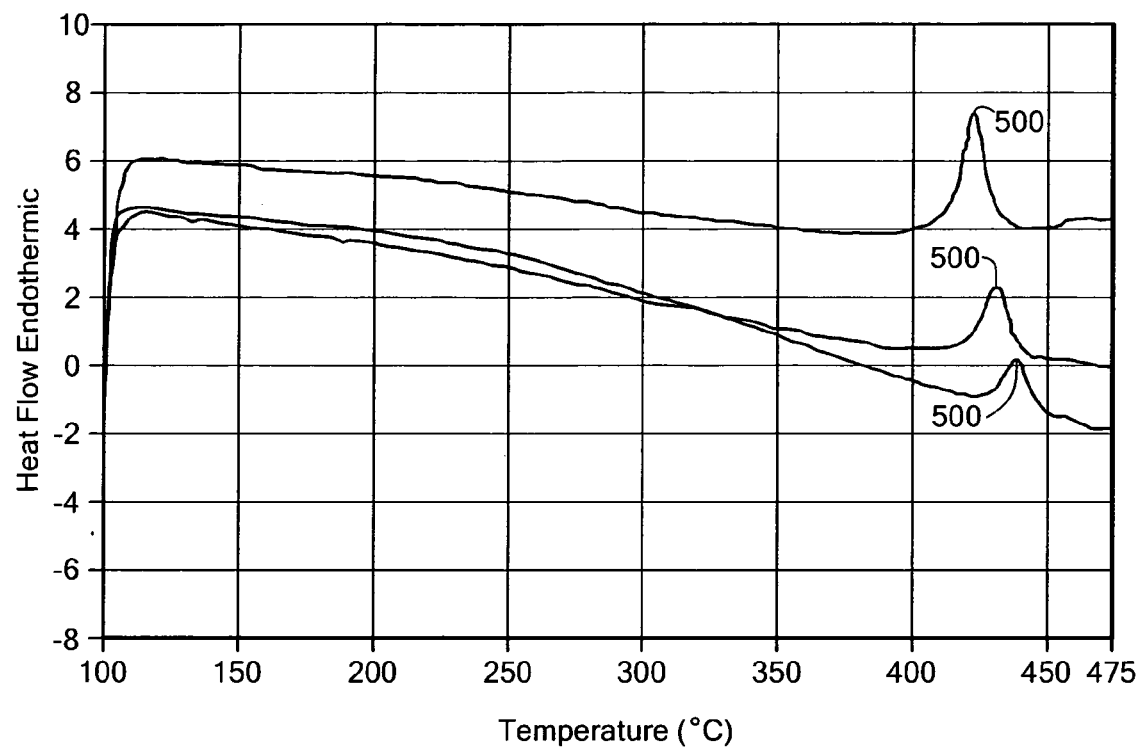
FIG. 5 is a set of dynamic scanning calorimetry (DSC) plots of liquid crystal polymer materials made according to one embodiment of the present invention.

FIG. 5 shows dynamic scanning calorimetry (DSC) plots of exemplary liquid crystal polymer materials made according to the disclosed method. DSC is a thermal analysis technique used to measure changes in heat flows associated with material transitions. DSC measurements provide both qualitative and quantitative data on endothermic (heat absorbing) and exothermic (heat evolving) processes. DSC is commonly used to determine the glass transition temperature and crystalline melting point of polymeric materials. A spike 500 in each plot shows the respective material's melting temperature. These melting temperatures exceed about 400° C., whereas the initial melting temperatures of the materials were between about 280° C. and about 370° C.

Exemplary original materials include those in a family of materials known as "aromatic polyesters" or liquid crystal polymers.

Figure 6:
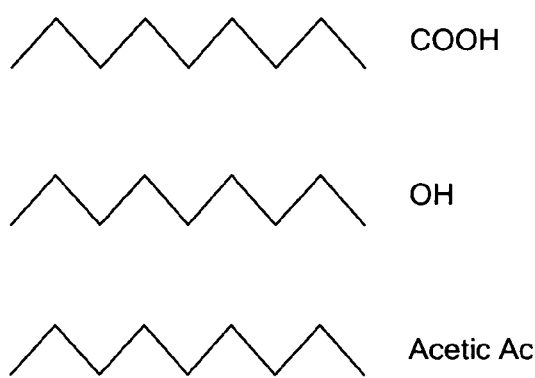
FIG. 6 is a schematic diagram of exemplary polymer molecules used to synthesize other polymer molecules, according to three embodiments of the present invention.
Figure 7:
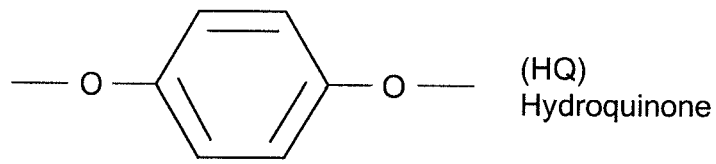
FIG. 7 contains schematic diagrams of exemplary monomer units used to synthesize polymer molecules, according to several embodiments of the present invention.
Figure 7:
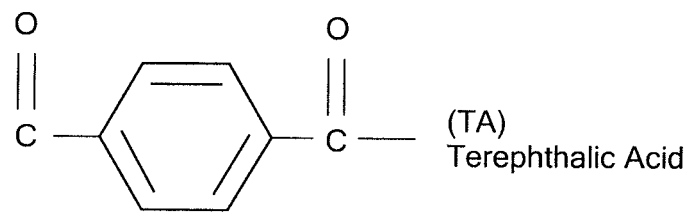
Figure 7:
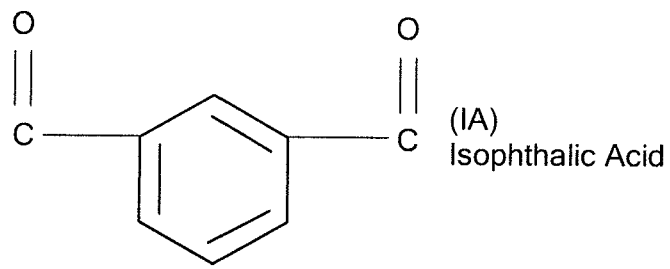
Figure 7:
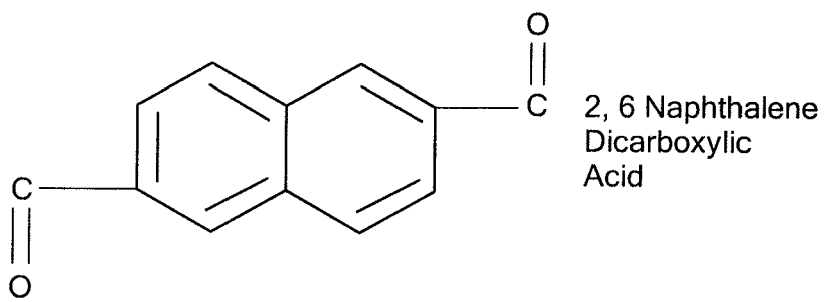
Figure 7:
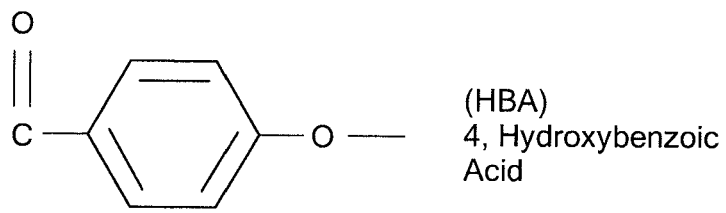
Figure 7:
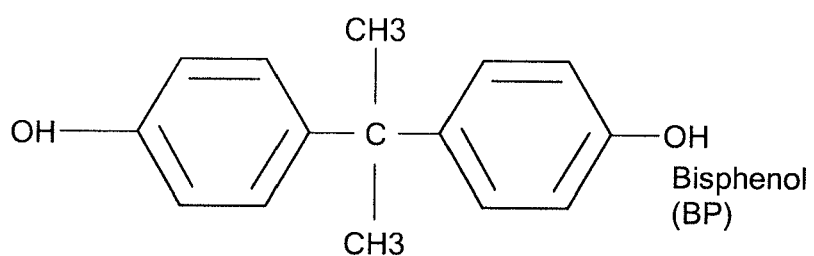

In one embodiment, ends of the original polymer chains contain one or more of the following groups: COOH, OH or acetic acid, as shown in FIG. 6. In one example of secondary polymerization, some acid end (COOH) groups of the original polymer chains bond with acetate end groups of other polymer chains, and other acid end groups of the original polymer chains bond with residual OH ends on yet other polymer chains, resulting in very long chain polymers. In this example, a polyester monomer unit of the form 4-hydroxybenzoic acid (HBA) (or, more generally, p-hydroxybenzoic acid), hydroquinone, bisphenol, terephthalic acid and/or 2-hydroxy-6-naphthoic acid is/are preferably present in the polymer chain. These monomer units are shown schematically in FIG. 7. In one embodiment, the secondary polymerization results in a cross-linked structure.

An exemplary ultra-high molecular weight material that can be made according to the disclosed method is a liquid crystal polymer, i.e., a polymer containing HBA monomer units, that is heated during secondary polymerization to a final temperature of about 390° C. Such a material has a melting temperature greater than about 420° C. Another, similarly made, exemplary material has a molecular weight greater than about 30,000 gm/mol. Yet another, similarly made, exemplary material has a tensile strength greater than about 25,000 psi. Another, similarly made, exemplary material has an elongation greater than about 2%. Yet another, similarly made, exemplary material includes more than about 200 repeating ester groups.

Figure 8:
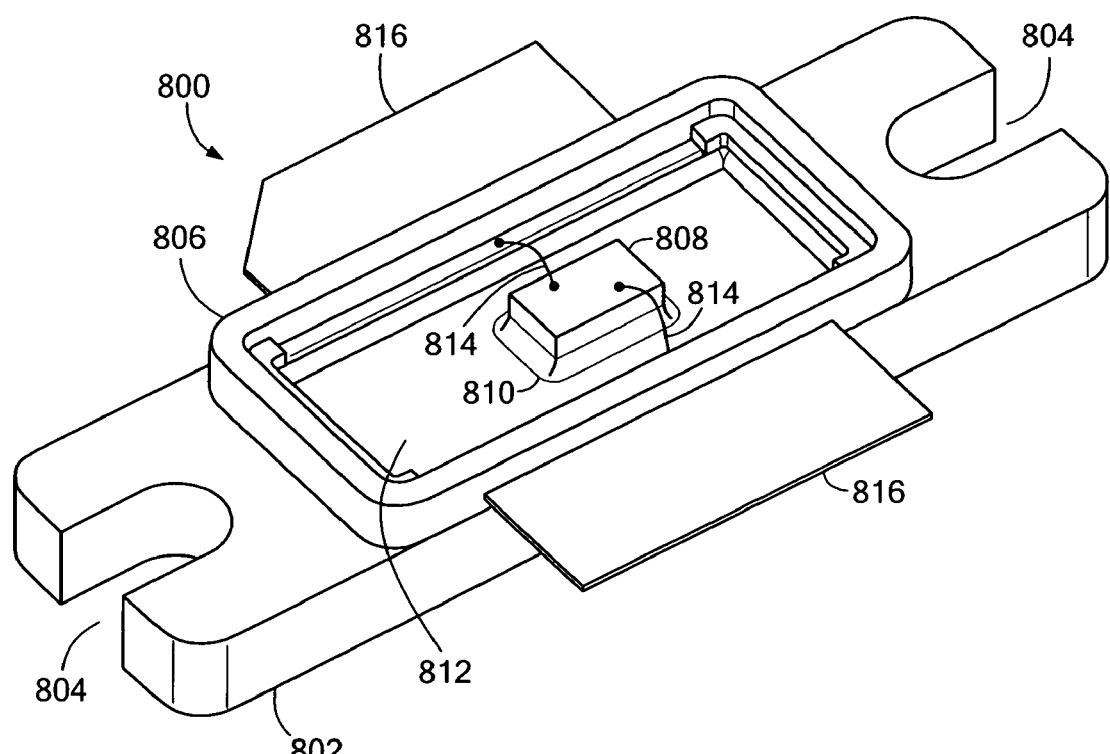
FIG. 8 is a diagram of an electronic circuit package made according to one embodiment of the present invention.

As noted, the disclosed plastic material can be used to make packages for microelectronics circuits. FIG. 8 illustrates such a package 800. A flange 802 is made of a highly thermally conductive material, such as a high-copper alloy, or another suitable material. The flange 802 includes slots 804, by which the flange can later be mechanically attached, such as by bolts, to a heat sink (not shown).

Figure 9:
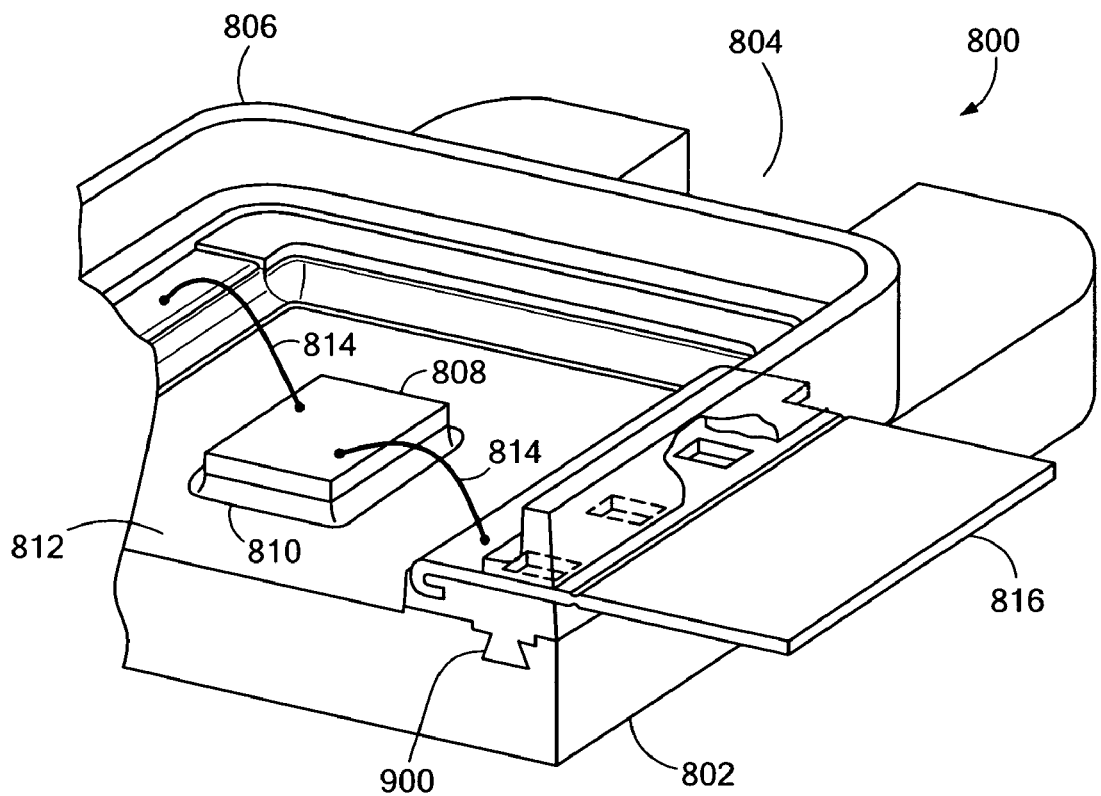
FIG. 9 is a cut-away diagram of an alternative embodiment of the circuit package of FIG. 8.
Figure 10:
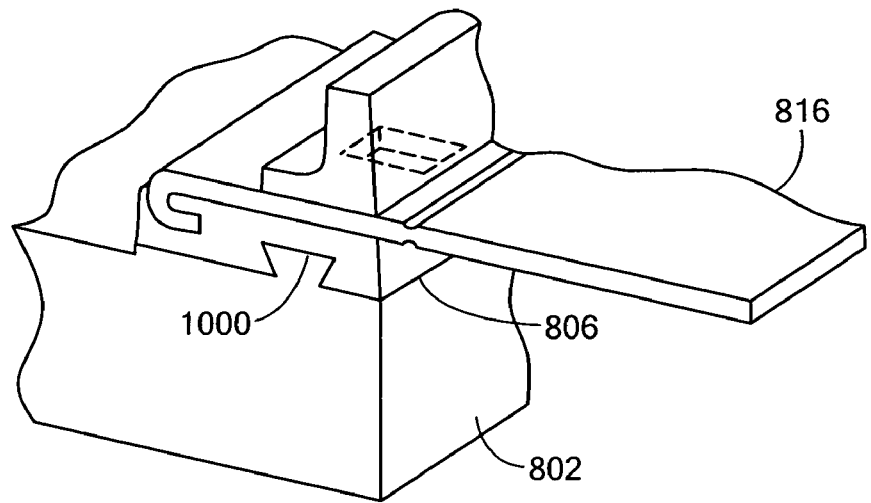
FIG. 10 is a cut-away diagram of another alternative embodiment of the circuit package of FIG. 8.
Figure 11A:
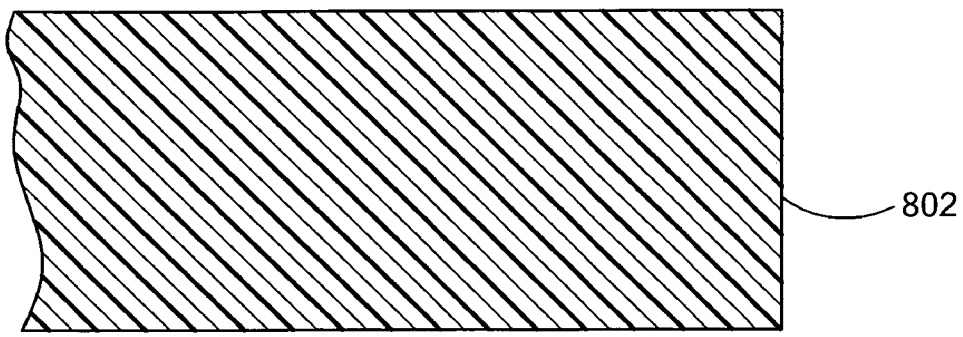
FIG. 11 (A-C) is a cross-sectional view of the circuit package of FIG. 9 showing a keyway during three stages of manufacture of the keyway.
Figure 11B:
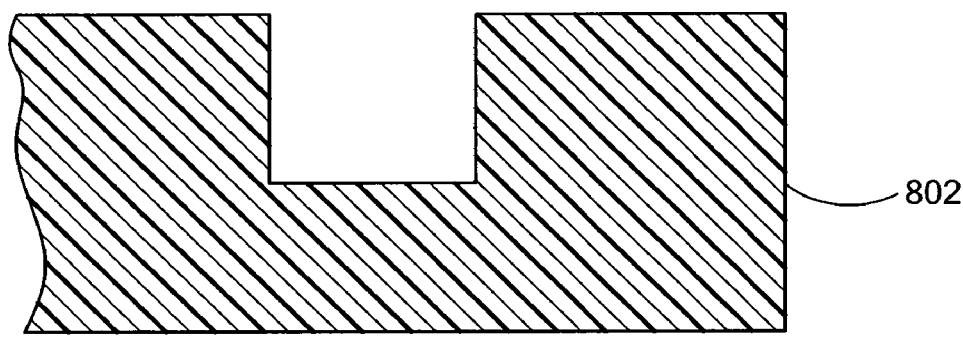
Figure 11C:
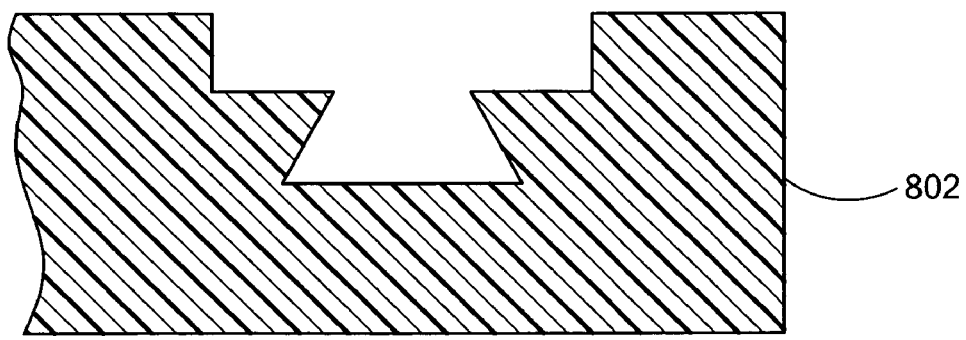

A dielectric frame 806 is made of a polymeric material before the disclosed secondary polymerization is performed on the polymeric material. The frame 806 is injection molded to the flange 802. Both the compounding temperature for the polymeric material and the molding temperature for the injection molding are less than the maximum temperature used in the subsequent secondary polymerization process. FIGS. 9 and 10 are cut-away views of alternative embodiments of the circuit package 800 of FIG. 8. The flange 802 optionally includes a concave keyway 900 (FIG. 9) or a convex key 1000 (FIG. 10), into which or around which the plastic material is injected during the injection molding process. The keyway 900 can be formed in the flange 802 by progressively stamping the flange 802 with a series of toolings, as shown in FIG. 11(A-C). The key 1000 can be similarly formed. Because the polymeric material is injection molded to the flange 802 before the melting temperature of the material is raised, conventional temperatures, processes and equipment can be used for the injection molding process.

After the frame 806 is injection molded to the flange 802, the disclosed secondary polymerization process is performed, as discussed above, and the melting temperature of the plastic material of the frame 806 is increased, such that the end-use temperature of the plastic material is higher than the compounding and the molding temperatures. After the melting temperature of the frame 806 has been increased, a die 808 (FIG. 8) is attached by solder 810 to a die-attached area 812 of the flange 802. Because the melting temperature of the frame 806 has been increased, the frame 806 can withstand the temperatures encountered when the die 808 is soldered to the flange 802, without damage to the frame 806. Wires 814 electrically connect the die 808 to leads 816.

Later, a lid (not shown) is attached to the frame 806, such as by ultrasonic welding, by epoxy or by another suitable method. The flange 802, the frame 806 and the lid provide a hermetically sealed cavity for the die 808. The cavity can be evacuated or filled with air, an inert gas, epoxy or another appropriate material. The flange 802, the frame 806 and the lid prevent infiltration of moisture, gases and other contaminants into the cavity.

Some circuit packages do not include a flange. In these packages, the frame is molded to a leadframe, and the die is electrically (and sometimes mechanically and/or thermally) connected to the leadframe. The above-described method of secondary polymerization applies to such flange-less packages and other circuit packages. For simplicity, any metal or other material in a circuit package, to which a frame is molded, is referred to hereinafter as a flange. Furthermore, the secondary polymerization process described with respect to circuit packages can be applied to other articles of manufacture that include components that are molded to other components.

A thermoplastic is a material that can be repeatedly softened by heating and hardened by cooling. Thus, a thermoplastic can be remoled by reheating the material. In contrast, a thermoset plastic is a material that will undergo or has undergone a chemical reaction ("curing") by the action of heat, catalysts, ultra-violet light, etc., leading to a relatively infusible state. Once cured, a thermoset material cannot be returned to the uncured state. Thus, thermoset materials cannot be repeatedly softened or remolded. The methods disclosed herein are applicable to thermoplastic and thermoset materials. For example, the frame of a circuit package can be made from a thermoplastic or from a thermoset material. Thus, the secondary polymerization process can be applied to already molded and frozen thermoplastic materials, resulting in a higher molecular weight thermoplastic that has a very high melting temperature. The secondary polymerization process can also be applied to a thermoset material, which no longer melts.

While the invention is described through the above-described exemplary embodiments, it will be understood by those of ordinary skill in the art that modifications to, and variations of, the illustrated embodiments may be made, without departing from the inventive concepts disclosed herein. For example, although secondary polymerization has been described as being performed after injection molding in the case of manufacturing circuit packages, secondary polymerization can also be performed on a material (while manufacturing circuit packages and other articles) before the material is injection molded. Moreover, while the preferred embodiments are described in connection with various illustrative monomers, starting polymers, temperatures, rates of increase in temperature and temperature hold times, one skilled in the art will recognize that substitutions for, and modifications of, these aspects are possible. Accordingly, the invention should not be viewed as limited, except by the scope and spirit of the appended claims.

What is claimed is:

1. A method of making a polymeric material, comprising:
    synthesizing a first polymeric material having a first melting temperature;

injection molding the first polymeric material into a shape;
heating the molded first polymeric material in its molded shape at a first rate of between about 0.1° C. per hour and about 10° C. per hour to a first predetermined temperature below the melting temperature of the first polymeric material; and
heating the first polymeric material in its molded shape at a second rate of between about 0.1° C. per hour and about 10° C. per hour to a second predetermined temperature higher than the melting temperature of the first polymeric material.

2. The method of claim 1, wherein synthesizing the first polymeric material comprises synthesizing a thermoplastic.

3. The method of claim 1, wherein synthesizing the first polymeric material comprises synthesizing a thermoset material.

4. The method of claim 1, further comprising, after heating the first polymeric material to the first predetermined temperature, maintaining the temperature of the first polymeric material within a predetermined range for at least a predetermined period of time.

5. The method of claim 1, wherein heating the first polymeric material to the second predetermined temperature comprises heating the first polymeric material sufficiently to cause polymer molecules in the first polymeric material to bond to other polymer molecules in the first polymeric material.

6. The method of claim 1, wherein heating the first polymeric material to the second predetermined temperature comprises heating the first polymeric material sufficiently to cause further polymerization of the first polymeric material and to increase the melting temperature of the polymeric material to a melting temperature higher than the melting temperature of the first polymeric material.

7. The method of claim 1, wherein synthesizing a first polymeric material comprises synthesizing a liquid crystal polymer.

8. A method of increasing the melting temperature of a plastic material, comprising:
injection molding the plastic material into a shape;
increasing the temperature of the molded material in its molded shape at a rate of between about 0.1° C. per hour and about 10° C. per hour until the temperature of the material reaches a first temperature between about 10° C. and about 30° C. below an initial melting temperature of the material;
maintaining the temperature of the material between about 10° C. and about 30° C. below the initial melting temperature of the material for at least about one hour; and
increasing the temperature of the material in its molded shape at a rate of between about 0.1° C. per hour and about 10° C. per hour until the temperature of the material reaches a second temperature between about 40° C. and about 50° C. below a desired melting temperature of the material.

9. The method of claim 8, wherein increasing the temperature of the material to the second temperature comprises increasing the temperature of the material to more than about 340° C.

10. The method of claim 8, wherein increasing the temperature of the material to the second temperature comprises increasing the temperature of the material to more than about 355° C.

11. The method of claim 8, wherein increasing the temperature of the material to the second temperature comprises increasing the temperature of the material to more than about 390° C.

12. The method of claim 8, wherein increasing the temperature of the material to the first temperature comprises increasing the temperature of a polymer having at least one COOH end group.

13. The method of claim 8, wherein increasing the temperature of the material to the first temperature comprises increasing the temperature of a polymer having at least one OH end group.

14. The method of claim 8, wherein increasing the temperature of the material to the first temperature comprises increasing the temperature of a polymer having at least one acetic acid end group.

15. The method of claim 8, wherein increasing the temperature of the material to the first temperature comprises increasing the temperature of a thermoplastic.

16. The method of claim 8, wherein increasing the temperature of the material to the first temperature comprises increasing the temperature of a thermoset material.

17. The method of claim 8, wherein increasing the temperature of the material to the first temperature comprises increasing the temperature of a polymer having at least one monomer unit chosen from the group consisting of:
hydroquinone;
bisphenol;
isophthalic acid;
p-hydroxybenzoic acid;
terephthalic acid; and
2-hydroxy-6-naphthoic acid.

18. The method of claim 8, further comprising forming a cross-linked structure.

19. A method of making a polymeric material, comprising:
synthesizing an intermediate polymeric material having an initial melting temperature;
injection molding the intermediate polymeric material into a shape; and after molding the intermediate polymeric material, further polymerizing the intermediate polymeric material by raising the temperature of the intermediate material in its molded shape above the initial melting temperature at a rate of between about 0.1° C. per hour and about 10° C. per hour.

20. The method of claim 19, wherein further polymerizing the intermediate polymeric material comprises:
after the intermediate polymeric material forms a solid material, further polymerizing the intermediate polymeric material.

21. The method of claim 19, wherein further polymerizing the intermediate polymeric material comprises:
while the intermediate polymeric material is a liquid, further polymerizing the intermediate polymeric material.

22. The method of claim 19, wherein further polymerizing the intermediate polymeric material comprises:
increasing the temperature of the intermediate polymeric material at a rate of between about 0.1° C. per hour and about 10° C. per hour until the temperature of the intermediate polymeric material reaches a first temperature between about 10° C. and about 30° C. below the initial melting temperature of the intermediate polymeric material;
maintaining the temperature of the intermediate polymeric material between about 10° C. and about 30° C. below the initial melting temperature of the intermediate polymeric material for at least about one hour; and
increasing the temperature of the intermediate polymeric material at a rate of between about 0.1° C. per hour and about 10° C. per hour until the temperature of the material reaches a second temperature between about 40° C. and about 50° C. below a predetermined temperature, the predetermined temperature being greater than the initial melting temperature of the intermediate polymeric material.

23. The method of claim 22, wherein increasing the temperature of the intermediate polymeric material to the second temperature comprises increasing the temperature of the intermediate polymeric material to more than about 340° C.

24. The method of claim 22, wherein increasing the temperature of the intermediate polymeric material to the second temperature comprises increasing the temperature of the intermediate polymeric material to more than about 355° C.

25. The method of claim 22, wherein increasing the temperature of the intermediate polymeric material to the second temperature comprises increasing the temperature of the intermediate polymeric material to more than about 390° C.

26. The method of claim 19, wherein further polymerizing the intermediate polymeric material comprises lengthening existing polymer chains in the intermediate polymeric material.

27. The method of claim 19, wherein further polymerizing the intermediate polymeric material comprises bonding exiting polymer chains in the intermediate polymeric material to other existing polymer chains in the intermediate material.

28. The method of claim 19, wherein synthesizing an intermediate polymeric material comprises synthesizing an intermediate polymeric material comprising p-hydroxybenzoic acid.

29. The method of claim 19, wherein synthesizing an intermediate polymeric material comprises synthesizing an intermediate polymeric material from p-hydroxybenzoic acid.

30. The method of claim 19, wherein synthesizing an intermediate polymeric material comprises synthesizing an intermediate polymeric material comprising a thermoplastic.

31. The method of claim 19, wherein synthesizing an intermediate polymeric material comprises synthesizing an intermediate polymeric material comprising a thermoset material.

32. A method of manufacturing a circuit package, comprising:
    injection molding a polymeric material to a flange, thereby forming a frame;
    increasing the temperature of the frame in its molded shape at a rate of between about 0.1° C. per hour and about 10° C. per hour until the temperature of the frame reaches a first temperature between about 10° C. and about 30° C. below an initial melting temperature of the polymeric material;
    maintaining the temperature of the polymeric material between about 10° C. and about 30° C. below the initial melting temperature of the polymeric material for at least about one hour; and
    increasing the temperature of the frame at a rate of between about 0.1° C. per hour and about 10° C. per hour until the temperature of the frame reaches a second temperature between about 40° C. and about 50° C. below a desired melting temperature of the frame which is higher than the initial melting temperature of the frame.

33. The method of claim 32, wherein increasing the temperature of the frame to the second temperature comprises increasing the temperature of the frame to more than about 340° C.

34. The method of claim 32, wherein increasing the temperature of the frame to the second temperature comprises increasing the temperature of the frame to more than about 355° C.

35. The method of claim 32, wherein increasing the temperature of the frame to the second temperature comprises increasing the temperature of the frame to more than about 390° C.

36. The method of claim 32, wherein increasing the temperature of the frame to the first temperature comprises increasing the temperature of a polymer having at least one COOH end group.

37. The method of claim 32, wherein increasing the temperature of the frame to the first temperature comprises increasing the temperature of a polymer having at least one OH end group.

38. The method of claim 32, wherein increasing the temperature of the frame to the first temperature comprises increasing the temperature of a polymer having at least one acetic acid end group.

39. The method of claim 32, wherein increasing the temperature of the frame to the first temperature comprises increasing the temperature of a polymer having at least one monomer unit chosen from the group consisting of:
    hydroquinone;
    bisphenol;
    p-hydroxybenzoic acid;
    terephthalic acid; and
    2-hydroxy-6-naphthoic acid.

40. The method of claim 32, further comprising forming a cross-linked structure in the frame.

41. The method of claim 32, wherein molding a polymeric material to the flange comprises molding a thermoplastic material to the flange.

42. The method of claim 32, wherein molding a polymeric material to the flange comprises molding a thermoset material to the flange.

43. The method of claim 32, further comprising:
    compounding the polymeric material at a compounding temperature that is less than the first temperature and less than the second temperature; and
    wherein molding the polymeric material comprises molding the polymeric material at a molding temperature that is less than the first temperature and less than the second temperature.

44. The method of claim 43, wherein increasing the temperature of the frame to the second temperature comprises increasing the temperature of the frame such that an end-use temperature of the frame is greater than the compounding temperature and greater than the molding temperature.

45. A method of manufacturing an article, comprising:
    injection molding a polymeric material to a component of the article;
    increasing the temperature of the molded polymeric material at a rate of between about 0.1° C. per hour and about 10° C. per hour until the temperature of the polymeric material reaches a first temperature between about 10° C. and about 30° C. below an initial melting temperature of the polymeric material;
    maintaining the temperature of the molded polymeric material between about 10° C. and about 30° C. below the initial melting temperature of the polymeric material for at least about one hour; and
    increasing the temperature of the molded polymeric material at a rate of between about 0.1° C. per hour and about 10° C. per hour until the temperature of the polymeric material reaches a second temperature between about 40° C. and about 50° C. below a desired melting temperature of the polymeric material which is higher than the initial melting temperature of the polymeric material.

46. The method of claim 45, wherein increasing the temperature of the polymeric material to the second temperature comprises increasing the temperature of the polymeric material to more than about 340° C.

47. The method of claim 45, wherein increasing the temperature of the polymeric material to the second temperature comprises increasing the temperature of the polymeric material to more than about 355° C.

48. The method of claim 45, wherein increasing the temperature of the polymeric material to the second temperature comprises increasing the temperature of the polymeric material to more than about 390° C.

49. The method of claim 6, wherein the melting temperature of the polymeric material is increased to at least 400° C.

50. The method of claim 49, wherein the melting temperature of the polymeric material is increased to at least 420° C.

51. The method of claim 6, wherein the melting temperature of the polymeric material is at least 100° C. higher than the melting temperature of the first polymeric material.

52. The method of claim 8, wherein the melting temperature of the plastic material is increased to at least 400° C.

53. The method of claim 52, wherein the melting temperature of the plastic material is increased to at least 420° C.

54. The method of claim 8, wherein the melting temperature of the plastic material is increased by at least 100° C.

55. The method of claim 19, wherein the melting temperature of the polymeric material is increased to at least 400° C.

56. The method of claim 55, wherein the melting temperature of the polymeric material is increased to at least 420° C.

57. The method of claim 19, wherein the melting temperature of the polymeric material is at least 100° C. higher than the melting temperature of the first polymeric material.

58. The method of claim 32, wherein the melting temperature of the polymeric material is increased to at least 400° C.

59. The method of claim 58, wherein the melting temperature of the polymeric material is increased to at least 420° C.

60. The method of claim 32, wherein the melting temperature of the polymeric material is increased by at least 100° C.

61. The method of claim 45, wherein the article manufactured has a final melting temperature of at least 400° C.

62. The method of claim 45, wherein the article manufactured has a final melting temperature of at least 420° C.

* * * * *